United States Patent
Shaeffer et al.

(10) Patent No.: US 10,331,587 B2
(45) Date of Patent: Jun. 25, 2019

(54) MEMORY CONTROLLER THAT USES A SPECIFIC TIMING REFERENCE SIGNAL IN CONNECTION WITH A DATA BURST FOLLOWING A SPECIFIED IDLE PERIOD

(71) Applicant: Rambus Inc., Sunnyvale, CA (US)

(72) Inventors: Ian Shaeffer, Los Gatos, CA (US); Thomas J. Giovannini, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/498,065

(22) Filed: Apr. 26, 2017

(65) Prior Publication Data
US 2018/0011805 A1     Jan. 11, 2018

Related U.S. Application Data

(63) Continuation of application No. 13/105,798, filed on May 11, 2011, now Pat. No. 9,665,507.

(60) Provisional application No. 61/366,806, filed on Jul. 22, 2010.

(51) Int. Cl.
| | |
|---|---|
| *G06F 12/00* | (2006.01) |
| *G06F 13/16* | (2006.01) |
| *G11C 7/10* | (2006.01) |
| *G11C 7/22* | (2006.01) |

(52) U.S. Cl.
CPC .......... *G06F 13/1689* (2013.01); *G06F 12/00* (2013.01); *G11C 7/10* (2013.01); *G11C 7/1066* (2013.01); *G11C 7/1093* (2013.01); *G11C 7/222* (2013.01); *G11C 2207/2254* (2013.01)

(58) Field of Classification Search
CPC ........................................................ G06F 12/00
USPC ............................................................ 711/167
See application file for complete search history.

(56) References Cited

U.S. PATENT DOCUMENTS

| | | | |
|---|---|---|---|
| 5,566,203 A | 10/1996 | Brief et al. | |
| 6,600,681 B1 | 7/2003 | Korger et al. | |
| 6,819,599 B2 | 11/2004 | Schaefer | |
| 7,606,089 B2 | 10/2009 | Joo | |
| 8,054,928 B2 | 11/2011 | Macri et al. | |
| 8,335,894 B1 * | 12/2012 | Rajan ..................... | G06F 12/00 711/154 |

(Continued)

OTHER PUBLICATIONS

Hynix Semiconductor, H5GQ1H24AFR, 1Gb (32M×32) GDDR5 SGRAM, Rev. 1.0, Nov. 2009, document is a general product description. 173 Pages.

(Continued)

*Primary Examiner* — Gautam Sain

(57) ABSTRACT

Apparatus and methods for operation of a memory controller, memory device and system are described. During operation, the memory controller transmits a read command which specifies that a memory device output data accessed from a memory core. This read command contains information which specifies whether the memory device is to commence outputting of a timing reference signal prior to commencing outputting of the data. The memory controller receives the timing reference signal if the information specified that the memory device output the timing reference signal. The memory controller subsequently samples the data output from the memory device based on information provided by the timing reference signal output from the memory device.

22 Claims, 7 Drawing Sheets

(56) References Cited

U.S. PATENT DOCUMENTS

| | | | |
|---|---|---|---|
| 2004/0022088 A1 | 2/2004 | Schaefer | |
| 2004/0052151 A1 | 3/2004 | Jacobs et al. | |
| 2005/0240838 A1 | 10/2005 | Iwai | |
| 2006/0015683 A1 | 1/2006 | Ashmore et al. | |
| 2006/0083081 A1 | 4/2006 | Park et al. | |
| 2006/0203548 A1 | 9/2006 | You | |
| 2006/0248261 A1 | 11/2006 | Jacob et al. | |
| 2006/0262586 A1 | 11/2006 | Solomon et al. | |
| 2007/0042758 A1 | 2/2007 | Bozzone | |
| 2008/0205187 A1 | 8/2008 | Pyeon | |
| 2010/0182855 A1 | 7/2010 | Koshizuka | |
| 2010/0188906 A1* | 7/2010 | Johnson | G11C 5/00 365/189.05 |
| 2010/0220536 A1* | 9/2010 | Coteus | G06F 13/1689 365/193 |
| 2011/0055671 A1 | 3/2011 | Kim et al. | |
| 2011/0199843 A1* | 8/2011 | Dreps | G06F 13/1689 365/193 |

OTHER PUBLICATIONS

Jedec Standard, GDDR5 SGRAM, JESD212, Dec. 2009, Jedec Solid State Technology Association Jedec.
PCT Search Report and the Written Opinion dated Nov. 30, 2011 re Int'l. Application No. PCT/US2011/040690. 9 Pages.
Shaeffer, Ian, U.S. Appl. No. 13/105,798, filed May 11, 2011, Information Disclosure Statement submitted Jan. 13, 2012. 9 pages.
Shaeffer, Ian, U.S. Appl. No. 13/105,798, filed May 11, 2011, re information Disclosure Statement submitted Dec. 15, 2011. 6 pages.

* cited by examiner

MEMORY CONTROLLER THAT USES A SPECIFIC TIMING REFERENCE SIGNAL IN CONNECTION WITH A DATA BURST FOLLOWING A SPECIFIED IDLE PERIOD

CROSS-REFERENCE TO RELATED APPLICATIONS

This application is a continuation of prior U.S. patent application Ser. No. 13/105,798, filed on May 11, 2011 for "Protocol including a command-specified timing signal," said prior application hereby being incorporated by reference. U.S. patent application Ser. No. 13/105,798, in turn, claims the benefit of U.S. Provisional Patent Application No. 61/366,806, filed on Jul. 22, 2010, also for "Protocol including a command-specified timing signal."

TECHNICAL FIELD

The present embodiments generally relate to techniques for communicating data between integrated circuit devices. More specifically, the present embodiments relate to a method, apparatus and protocol for high speed signaling between a memory device and a memory controller.

DETAILED DESCRIPTION

Figure 1A:
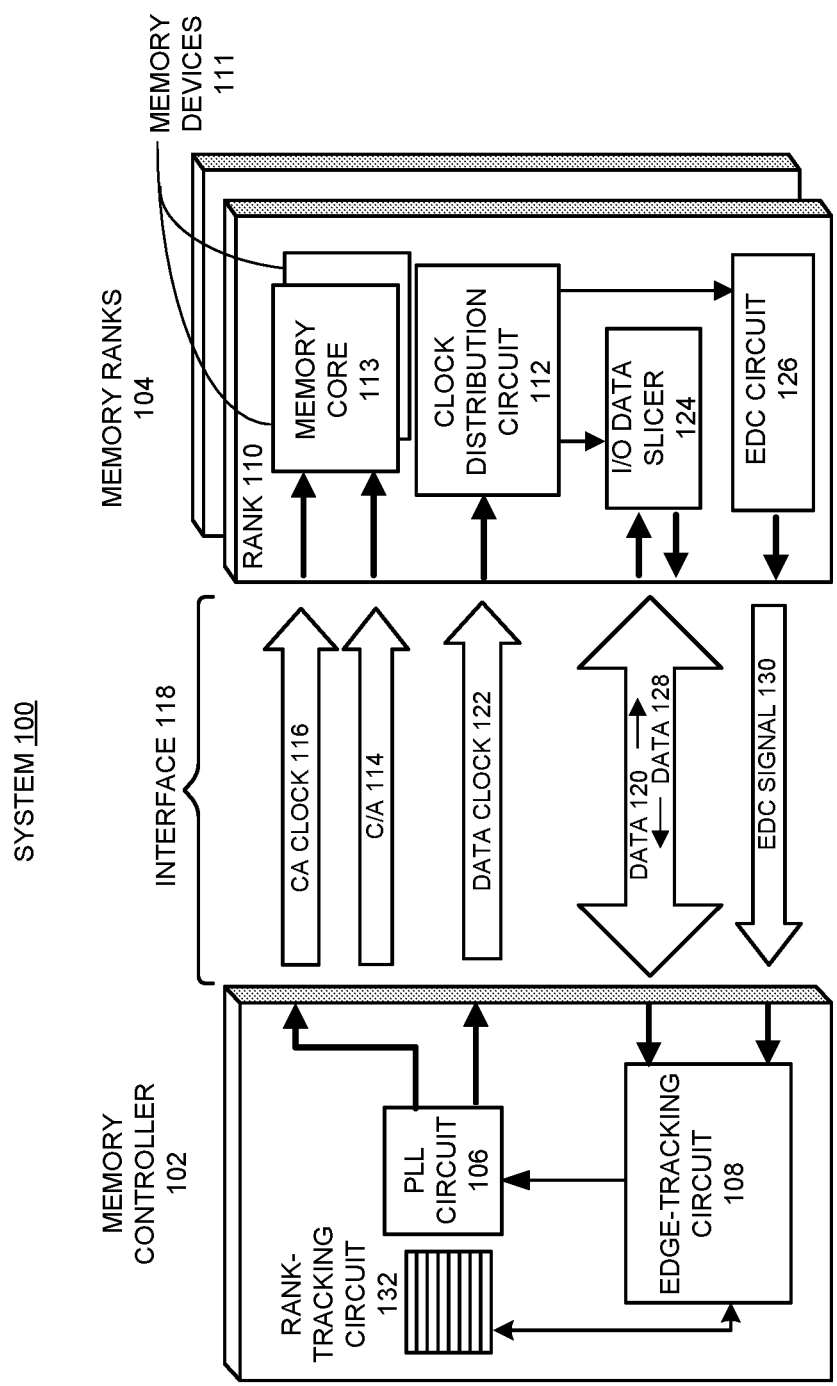
FIG. 1A presents a block diagram illustrating a system which performs timing updates between a memory controller and at least one memory device.

The following description is presented to enable any person skilled in the art to make and use the invention, and is provided in the context of a particular example application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

For computer systems, such as servers which contain numerous ranks of memory, idle power may be an issue. At any given time at most one rank is actively accessed, while all other ranks are idle but still consuming idle power. In some servers, this idle power can exceed active power if there are a large number of idle ranks. In such systems, power can be saved by moving timing control components, such as phase-locked loop (PLL) or delay-locked loop (DLL), from the ranks to the memory controller (which typically controls multiple ranks). In such designs, timing information can be provided to the memory controller from individual ranks to make timing updates to compensate for the noise and drift of the ranks. Such timing information can be conveyed via data signaling resources, for example, as a timing preamble that precedes a data burst received by the controller via the data signaling resources. Other signaling resources that are common to a given rank of memory devices and the controller may also be used to transfer the timing information between the rank and the controller.

Timing information received by the memory controller for a given rank is available when the rank is actively accessed (e.g., through a read or write command). By utilizing certain common timing reference/data resources for multiple ranks, when accessing a given rank, no timing information may be received from other ranks in the memory system. During this time, supply voltage and temperature may drift, which can cause the delay of the circuitry in the individual ranks to change. Moreover, high-frequency power supply noise can also shift the timing of the ranks. Hence, if a rank has not been accessed for some period of time, it is necessary to first perform a timing update for the rank before the rank can be accessed.

The following description presents various exemplary methods, protocols and apparatus for performing timing updates for memory transactions between a memory controller and a memory device (e.g., in a multi-rank system). In some embodiments, at the beginning of accesses to memory devices in a memory rank (or a "rank"), for example, after the rank has been idle for a time period, the memory controller transmits, to a memory device, a read command containing information which specifies whether the memory device is to output a timing reference signal ("TRS") prior to outputting of data in response to the read command. In an embodiment, the information is a digital bit or a special flag and is referred to as a preamble request flag. When the memory device, upon condition that the information specifies a TRS, outputs the TRS to the controller, the controller will receive the TRS before receiving a first bit of the subsequent data. The controller, upon receipt of the TRS, can use the TRS for the sampling of the data. For example, the TRS is used to sample the data or, as is described in more detail below, the controller can derive phase information from the TRS to optimize a sampling point for the data at the input sampler of the controller device. For example, the controller can update the phase of an internal sampling clock based on phase information derived from the TRS, where the internal sampling clock is an internal timing reference provided to an input sampler, in the controller, used to sample incoming read data output by the memory device.

In an embodiment, the TRS is a calibration preamble and in response to the information specifying a calibration preamble, the memory device transmits the calibration preamble from the memory device to the memory controller. The memory controller subsequently uses the calibration preamble to adjust receive timing for sampling, at the memory controller, the data output from the memory device. The receive timing at the memory controller may be adjusted to compensate for low-frequency timing drifts and timing jitter.

In some embodiments, the TRS has a burst length which is determined in part by the duration of an idle period for the rank. The burst length of the timing reference signal may be set to be the same as the burst length of the data (output in response to the read command). The TRS, in an embodiment, is conveyed from the memory device, to the memory controller via a signaling resource (i.e., signal traces, pins etc.), that is also used to transfer error detection and correction information (EDC). Over the signaling resource, the timing reference signal may be conveyed in a time shifted manner relative to the data burst being transferred over a separate signaling resource.

In some embodiments, the calibration preamble is only requested when the first transaction to a newly accessed rank is a read access. In the discussion below, the terms "timing updates" and "phase updates" are used interchangeably, and the terms "timing reference signal (TRS)", "calibration preamble" and "preamble" may also be considered as being used interchangeably. In addition, "ranks" are used to refer to 1 or more memory devices which are accessed and (collectively in the case of more than 1 memory device) transfers data for a given data access operation.

FIG. 1A presents a block diagram illustrating a system 100 which performs timing updates between a memory controller 102 and a set of memory ranks (such as DRAM ranks) 104. Memory controller 102 includes a PLL circuit 106 and an edge tracking circuit 108. Memory ranks 104 include two or more ranks, such as a rank 110. In an embodiment, each rank 110 includes one or more memory devices 111 and a clock distribution circuit 112, and each memory device 111 is a single chip having a memory core 113.

During a memory access to an active rank 110, memory controller 102 transmits command/address (C/A) 114 and command (CA) clock 116 to rank 110 over a chip-to-chip interconnect 118. Memory controller 102 can also transmit data 120 and data clock 122 to rank 110 over chip-to-chip interconnect 118. In some embodiments, data clock 122 is a full-bit-rate differential data clock (DCLK) for the data interface on rank 110, which provides a clock edge per bit, whereas CA clock 116 is a differential clock operating at one-quarter the rate of data clock 122, which is used for timing on the CA interface and for memory core 111. Note that the memory device CA input samplers (not shown) on rank 110 are directly clocked by CA clock 116, while write data 120 is directly clocked on rank 110 by data clock 122.

Memory rank 110 also receives data 120 and data clock 122, and distributes data clock 122 through clock distribution circuit 112 to both an input/output (I/O) data slicer 124 and an error detection and correction (EDC) circuit 126. I/O data slicer 124 includes a transmitter circuit to transmit data 128 and EDC circuit 126 includes a transmitter circuit to transmit an EDC signal 130 back to memory controller 102. Note that both data 128 and EDC signal 130 contain phase information regarding the memory transactions taking place on rank 110. In some embodiments, EDC signal 130 contains CRC codes, which are interspersed with a toggling idle pattern to achieve a minimum or predetermined number of EDC signal edge transitions (edge density).

Edge tracking circuit 108 on memory controller 102 receives both data 128 and EDC signal 130, and subsequently uses clock-data-recovery (CDR)-like circuits to extract phase information from the received data for rank 110. This phase information is then sent to PLL circuit 106, which uses the phase information to perform phase updates for data clock 122 to compensate for timing drift and timing jitter for rank 110. PLL circuit 106 also updates CA clock 116 based on the same phase information from edge tracking circuit 108.

In an embodiment, to facilitate the memory controller switching between servicing read operations directed to different ranks, phase information for each individual rank can be stored at the memory controller. For example, in the embodiment illustrated in FIG. 1A, memory controller 102 includes a rank-tracking circuit 132 coupled to edge-tracking circuit 108, which stores phase information for each of the memory ranks 104. Hence, the phase information for a new rank to be accessed is first loaded into a phase mixer after a rank switch occurs. At the same time, the most recently updated phase information for a previously accessed rank is stored into rank-tracking circuit 132.

When a new rank is accessed after an idle period for the rank, data and an EDC signal eventually become available from the new rank. It is possible to use the EDC signal to perform timing updates for the new rank using the above-described timing update loop in FIG. 1A. However, this timing update loop involves feedback and a long path delay which may not be sufficiently fast to track high-frequency timing jitter, such as power supply induced jitter (PSIJ). Moreover, the EDC signal only captures timing errors for preceding transactions, and therefore trails behind the data used to produce the EDC signal. Hence, during read transactions, the memory controller only receives the EDC signal after read data has already been received without associated clock phase updates.

Some of the presently described techniques enable rapid phase updates for a rank which is being accessed for the first time after an idle period. This is accomplished by initially transmitting a timing reference signal (TRS) from the rank to the memory controller before the first read data packet and the corresponding EDC packet are transmitted. In some embodiments, the timing reference signal may be added to the head of the first available read data burst being transmitted from a newly accessed rank to the memory controller. Upon receiving the TRS, the memory controller may perform fast phase updates within the duration of the TRS to correct a substantial portion of the timing drift and jitter for the rank. In some embodiments, this TRS comprises a toggling pattern which provides a predetermined number of timing edges.

Figure 1B:
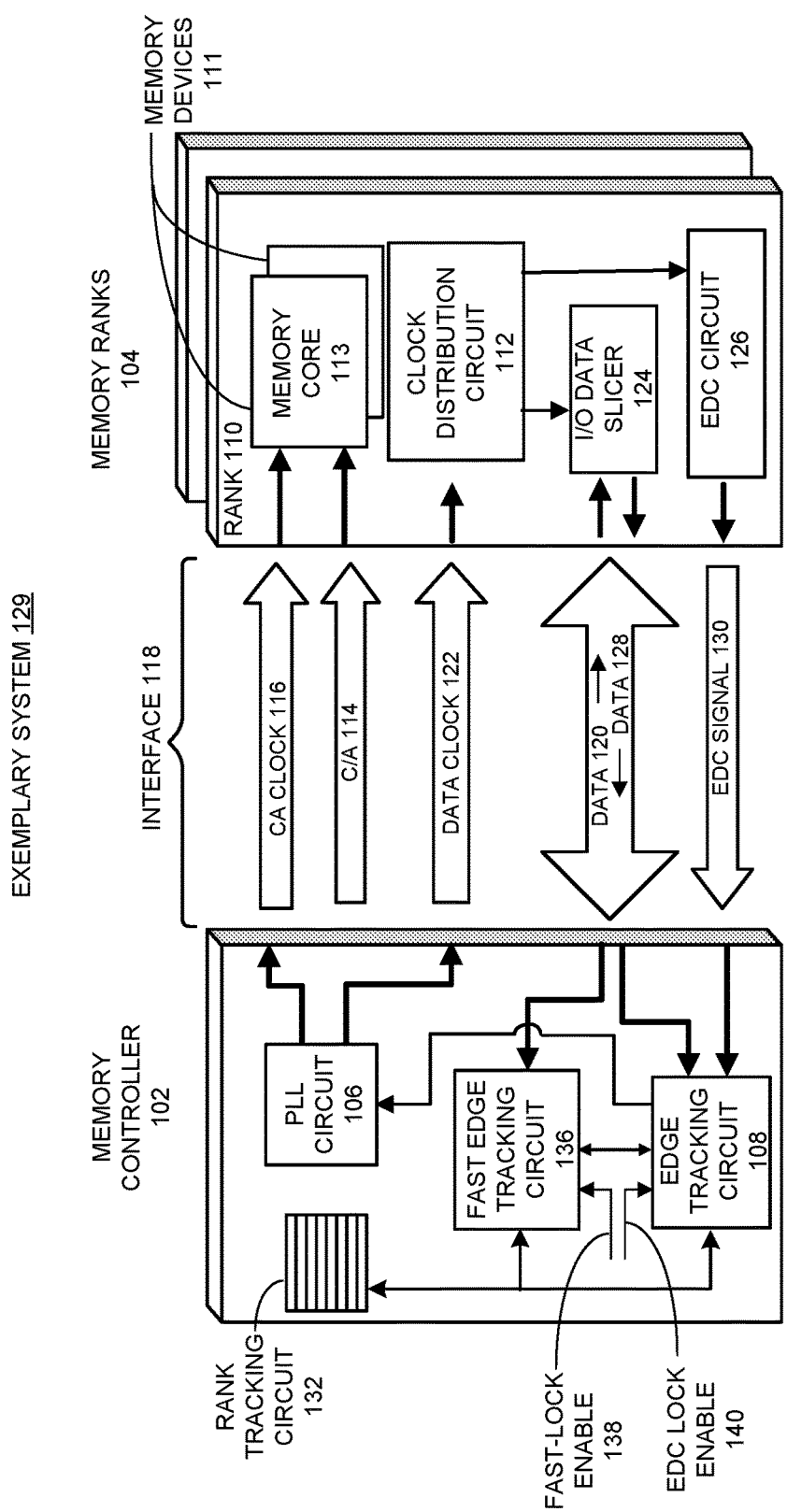
FIG. 1B presents a block diagram illustrating an exemplary system which performs fast timing updates between a memory controller and a set of memory ranks.

FIG. 1B presents an example embodiment illustrating system 129 which performs fast timing updates between a memory controller 102 and a set of memory ranks 104. As illustrated in FIG. 1B, a fast edge tracking circuit 136 is included in memory controller 102's clock architecture to provide fast phase updates within a received calibration preamble. For example, assume fast edge tracking circuit 136 receives data 128 from the new rank being accessed. If data 128 contains a calibration preamble, fast edge tracking circuit 136 uses the toggling pattern in the calibration preamble to make fast phase updates to a data clock used to capture the actual read data in data 128 following the calibration preamble. In this embodiment, after the initial updates based on the calibration preamble have been made, edge tracking circuit 108 performs subsequent phase updates during data transactions following the calibration preamble. In some embodiments, fast edge tracking circuit 136 operates at a significantly faster clock rate than edge tracking circuit 108, which allows the phase update to complete within a preamble duration, before the actual read data arrives at the memory controller. Furthermore, to ensure their independent operation without interfering with each other, fast edge tracking circuit 136 and edge tracking circuit 108 can be gated by different control signals, namely fast lock enable 138 and EDC lock enable 140 in FIG. 1B.

The additional phase adjustment capability provided by fast edge tracking circuit 136 in the clock architecture of memory controller 102 facilitates additional noise tracking and can relax the design requirements for the clock distribution circuit 112 on memory ranks 104. Moreover, fast edge tracking circuit 136 can have a shorter adjustment range for accommodating the timing drift expected from the idle period between accesses to a given rank. This amount of drift may also be bounded by specifying a maximum allowable idle period between accesses to a given rank.

Figure 2:
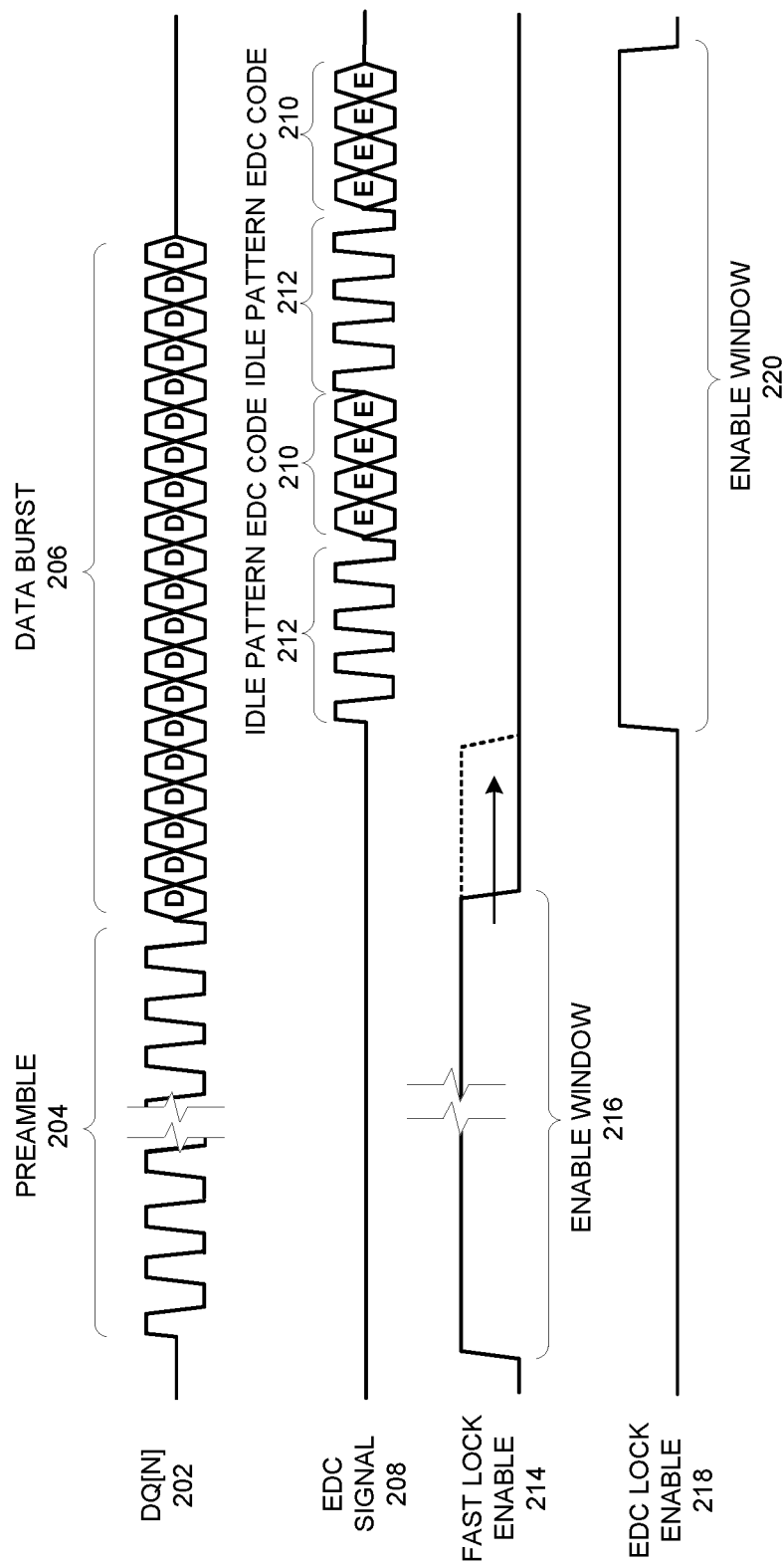
FIG. 2 presents a simplified timing diagram illustrating preamble-based fast timing updates between a memory controller and a rank.

FIG. 2 presents a simplified timing diagram illustrating preamble-based fast timing updates between a memory controller and a rank in accordance with an embodiment. As illustrated in FIG. 2, a data signal DQ[n] 202 comprises the beginning of a data pattern received at a memory controller from a new rank [n] being accessed after an idle period. DQ[n] 202 begins with a calibration preamble 204 comprising a toggling pattern which contains a predetermined number of edges. Preamble 204 is immediately followed by a data burst 206 which has a predetermined burst length for example, 4, 8, 16, 32 bits or 64 bits. An EDC signal 208 associated with data burst 206 is also received by the memory controller from the same rank. Note that EDC signal 208 trails both preamble 204 and data burst 206.

EDC signal 208 contains EDC codes 210 interspersed with toggling idle patterns 212 to achieve a minimum edge density (i.e., a predetermined number of signal transitions during a given time interval) in EDC signal 208. EDC codes 210 can include any type of EDC code, such as a CRC code. Note that EDC codes 210 can be of different lengths and can occur in different orders with the idle patterns or without the idle patterns at all. While the edge density in EDC codes 210 can be guaranteed by using the idle patterns, other techniques (e.g., various coding styles on top of the EDC codes) can be used to accomplish the same. In some embodiments, no special technique is used in EDC codes 210, and the system relies on probability to provide enough edges.

Upon receiving DQ[n] 202, the memory controller uses preamble 204 to perform a fast phase update without using a time-consuming feedback mechanism. A fast lock enable signal 214, which has an enable window 216 substantially time-aligned with preamble 204, is used to gate the fast updates at a fast clock rate. After completing the fast phase updates, normal phase updates can be performed based on EDC signal 208. More specifically, an EDC lock enable 218 which has an enable window 220 substantially time-aligned with EDC code 210 is used to gate the normal phase updates at a normal slow clock rate which may involve a feedback loop. In some embodiments, however, the enable window 216 of fast lock enable 214 may be extended (as shown by the dotted line) to the beginning of enable window 220 in EDC lock enable 218. In this embodiment, the initial phase updates (before the EDC-based update) include not only the fast-lock adjustments from preamble 204, but also some phase adjustments based on the first portion of data burst 206.

Figure 3:
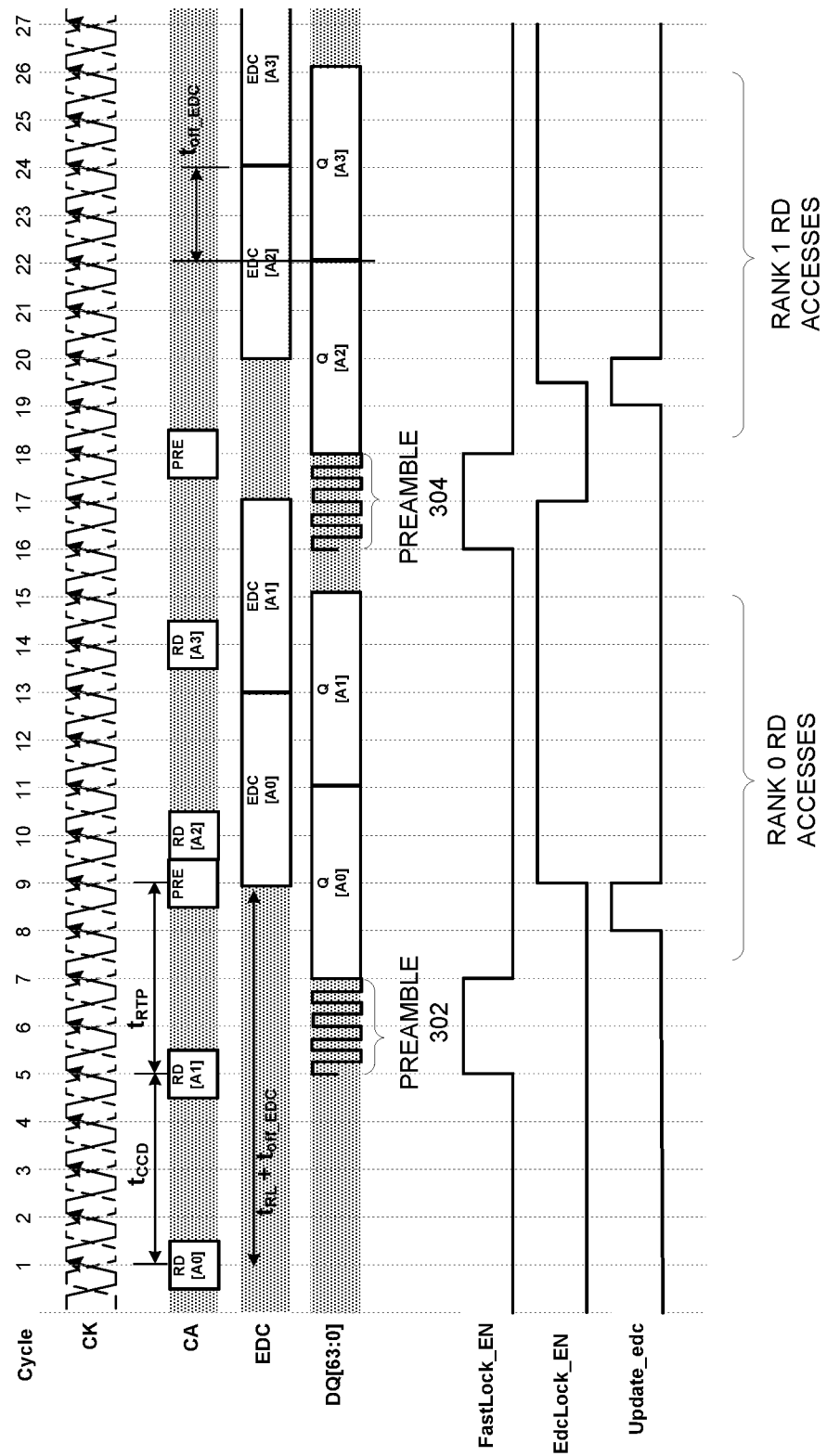
FIG. 3 presents a timing diagram illustrating preamble-based fast timing updates during read memory transactions on multiple ranks.

FIG. 3 presents a timing diagram illustrating preamble-based fast timing updates during read memory transactions on multiple ranks according to an embodiment. As illustrated in FIG. 3, a memory controller issues memory commands (CA), which include two consecutive read commands RD[A0] and RD[A1] directed to a rank 0. Note that RD[A0] is the first memory access request issued to rank 0 after an idle period for rank 0 transpires. In response, a memory device in rank 0 prepends a calibration preamble 302 to read data Q[A0].

After the controller issues read command RD[A1], a rank switch occurs from rank 0 to idle rank 1. More specifically, immediately after issuing a precharge command PRE to close off the access to rank 0, two consecutive read commands RD[A2] and RD[A3] are issued to rank 1, wherein RD[A2] is the first memory access request on rank 1 after the idle period on rank 1. In response, rank 1 prepends a calibration preamble to read data Q[A2].

Some embodiments use a "read with preamble" command to support timing updates in the controller clock architecture when the memory controller accesses a rank of memory that has not been accessed for some period of time. More specifically, the memory controller is configured to identify a condition when a rank is to be accessed for the first time after an idle period, and the first memory access to the rank is a read. For example, this condition occurs immediately before RD[A0] and RD[A2] in FIG. 3. When this condition is identified, the memory controller issues the read command containing a preamble request flag to the rank. Upon receiving the read command at the rank, the preamble request flag causes the rank to send a calibration preamble before transmitting the requested read data to the memory controller. The memory controller then uses the calibration preamble to update the read clock phase at the memory controller.

In one embodiment, the preamble request flag is a 1-bit field in the read command. For example, a '1' provided in the 1-bit field provides for a "read with preamble" command, and a '0' provided in the 1-bit field provides for a "read without preamble" command. In other embodiments, the preamble request flag is encoded in a multi-bit field in the read command and could be combined with other command variants of the read command, for example, a read with/without auto precharge bit that specifies whether sense amplifiers of the memory device should be automatically precharged following the read operation. Another command variant of the "read with preamble" command is a "preamble without data" command that specifies that the memory device output a timing reference signal to the controller device with no succeeding data burst being accessed during the transaction with memory. This command option provides that after a predetermined idle period to an idle rank, the memory controller flexibly has the option to schedule a receive timing update to that idle rank by specifying that a memory device of the rank transmit a timing reference signal with no accompanying data burst.

Generally, the TRS is predetermined to provide enough edges to perform the required timing updates before the read data is captured. The length of the TRS may be specified by a field in the read with preamble command or "statically" programmed to accommodate a given memory controller architecture and can be stored in registers on target memory devices of a rank and/or the memory controller. For example, some preamble burst lengths can be programmed to be 4, 8, 16, and 32 clock cycles. In one embodiment, two or more length values are programmed in registers on the targeted memory device and a field in the command selects from the two or more length values.

In some embodiments, a preamble request command includes a command field (one or more bits long) specifying the length of the TRS to allow the memory controller to specify the length of the preamble as needed based on various factors, such as the amount of elapsed time since the last rank access. In some embodiments, the memory controller can determine the length of the preamble based at least in part on the idle time of a given rank since the last access (i.e., an idle time-based length). It selects a shorter length for a shorter idle time and a longer length for a longer idle time. For example, the controller can use a one-bit command field to determine whether to send a long (e.g., 32 cycles) preamble or a short (e.g., 16 cycles) preamble. In another embodiment, the controller can simply use a bit of the command field to specify whether to perform a fine adjustment with a long preamble, or a fast adjustment with a short preamble based on run-time factors associated with the operation of the memory system.

The calibration preamble may be only needed for the first read transaction after an idle period; once the timing updates have been completed, any further transactions to the active rank will use EDC edges to maintain phase updates. Note that if the first memory transaction to a previously idle rank is a write transaction, the read timing can be automatically updated through the edges returned on the EDC line. We describe this situation in more detail below.

Figure 4A:
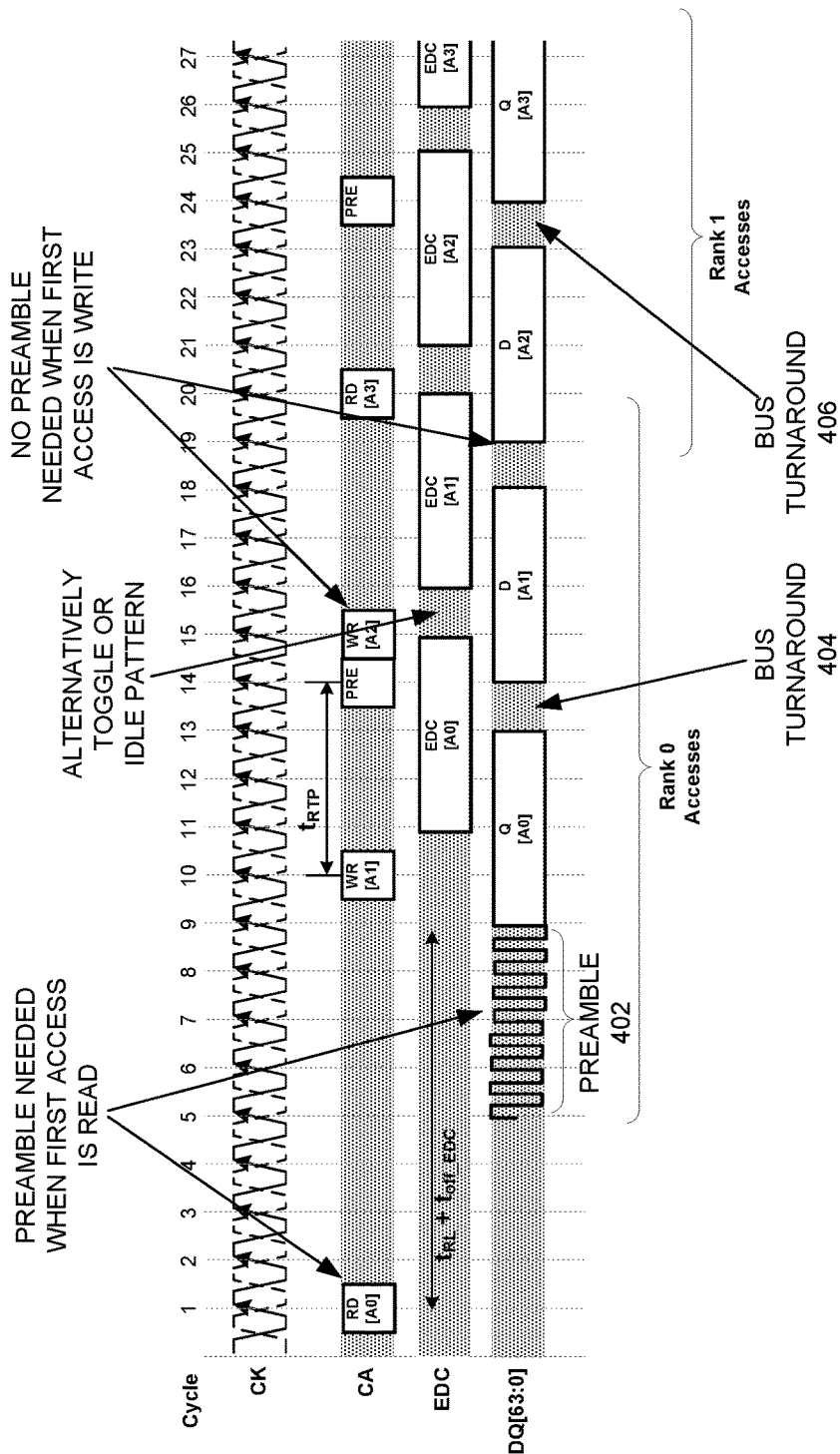
FIG. 4A presents a timing diagram illustrating preamble-based fast timing updates during both write and read memory transactions on multiple ranks.

FIG. 4A presents a timing diagram illustrating preamble-based fast timing updates during both write and read memory transactions on multiple ranks. As illustrated in FIG. 4A, a memory controller issues a memory command (CA), which includes four consecutive memory access requests: A0-A1, which are directed to rank 0, and A2-A3, which are directed to rank 1. The first memory access command RD[A0] is issued to rank 0, wherein RD[A0] is the first memory access request on rank 0 after an idle period for rank 0. In response, rank 0 prepends a calibration preamble 402 to read data Q[A0] returned for RD[A0].

Next, a write command WR[A1] is issued to rank 0 which causes a bus turnaround 404. Moreover, WR[A1] is the first write to rank 0 after the memory controller switches rank to rank 0. In this embodiment, rank 0 does not send another calibration preamble prior to receiving write data D[A1] from the memory controller. As illustrated in FIG. 4A, while D[A1] is being transmitted, EDC data EDC[A0] associated with read data Q[A0] is being received by the memory controller. Hence, the memory controller can use EDC[A0] to perform phase updates both during bus turnaround 404 and at the beginning of transmitting write data D[A1] to rank 0. Also, note that since there is not a rank switch between the read to A0 and write to A1, the EDC signal may alternatively continue to toggle or otherwise provide an "idle pattern" during the bubble period between A0 and A1 as is illustrated by the arrow in FIG. 4A. This idle pattern could be pre-defined or register programmable. It may also be command driven. For example, an extra command on the CA bus may actually be used to signal the DRAM that it will continue to be the rank that "owns" the data bus. (The DRAM could determine this itself based on its internal state machine, given that the write command has already been received by the DRAM prior to the "bubble" period.)

After issuing write command WR[A1], the memory controller switches ranks from rank 0 to idle rank 1. More specifically, immediately after issuing a precharge command PRE to close off the access to rank 0, a write command WR[A2] is issued to rank 1, wherein WR[A2] is the first memory access request on rank 1 after the idle period on rank 1. In the embodiment of FIG. 4A, rank 1 does not send a calibration preamble before receiving write data D[A2] from the memory controller.

In an alternative embodiment to FIG. 4A, before issuing the write command WR[A2] to rank 1 after the rank switch, the memory controller can send a "preamble only" command to rank 1. This preamble only command causes rank 1 to send only a calibration preamble with a predetermined number of edges to the memory controller. The memory controller subsequently uses the calibration preamble to determine the amount of timing drift (due to voltage, temperature, etc.) that has occurred on rank 1. The memory controller can then compensate for the timing drift prior to transmitting the write data D[A2] to rank 1.

In a variation to the preamble only command technique, before issuing the write command WR[A2] to rank 1, the memory controller can issue an "address-less" or "data-less" read command to trigger a calibration preamble to be generated by rank 1 (because this is the first read command after the memory controller starts accessing rank 1). As a result, the calibration preamble is sent to the memory controller without causing any read data to be sent.

Note that, similar to the read with preamble command, the data-less preambles can have their length specified by a field in the "data-less" read command or "statically" programmed in a register on the targeted memory device. In one embodiment, two or more length values are programmed in registers on the targeted memory device and a field in the command selects from the two or more length values.

Referring back to FIG. 4A, note that after sending write command WR[A2] to rank 1, a read command RD[A3] is subsequently issued to rank 1, which causes another bus turnaround 406. In this case, RD[A3] is the first read command directed to rank 1 after the memory controller switched to rank 1. In this situation, rank 1 does not send a calibration preamble before sending read data Q[A3] to the memory controller. This is because if the first memory transaction is a write (e.g., WR[A2]), the memory controller will already have received phase information from the EDC signal (e.g., EDC[A2]) during the write transaction, thereby allowing an update to the read clock phase, before a subsequent read transaction (e.g., RD[A3]) is initiated. As illustrated in FIG. 4A, while WR[A2] is in progress, EDC data EDC[A2] (associated with write data D[A2]) is received by the memory controller. Hence, the memory controller can use EDC[A2] to perform phase updates both during bus turnaround 406, and at the beginning of read data Q[A3] from rank 1.

Note that, while the embodiments illustrated in FIGS. 3 and 4 only illustrate two memory transactions on a given rank, subsequent memory transactions to the same rank do not require a calibration preamble. For example, a series of accesses to the same rank can commence with a read with preamble command (i.e. the first memory access after an idle period on the rank) followed by a write command, which is then followed by a read without preamble command.

In one embodiment, the memory controller can detect ranks that have not been accessed for a long period time. To prevent a large timing drift, which may be difficult to correct with a reasonable length preamble, the controller can periodically "talk" to a rank if the rank has been idle longer than a predetermined maximum time by sending a read with preamble command or a data-less read command to that rank. By sending such commands periodically, the memory controller avoids the need to perform later calibration operations that would necessitate longer calibration preambles, or a more exhaustive calibration process, such as one performed upon initialization of the system.

The above-described techniques and apparatus can be used in different systems having chips that that communicate with one another via chip-to-chip interfaces. Examples of such systems include front-side buses, and systems employing different types of memory devices and memory controllers that control the operation of these memory devices. Examples of these systems include, but are not limited to, mobile systems, desktop computers, servers, and/or graphics applications. The memory devices can include dynamic random access memory (DRAM). Moreover, the DRAM may be, e.g., graphics double data rate (GDDR, GDDR2, GDDR3, GDDR4, GDDR5, and future generations) and double data rate (DDR2, DDR3 and future memory types).

The techniques and apparatus described may be applicable to other types of memory, for example, flash and other types of non-volatile memory and static random access memory (SRAM). Moreover, throughout this description, a clock signal is described; it should be understood that a clock signal in the context of the instant description may be embodied as a strobe signal or, generally, as a signal that conveys timing information, and is not limited to a signal that is strictly periodic. For example, a timing reference may be a clock signal, which is periodic (however, it may be gated), or may be a strobe signal (that is aperiodic in the sense that it indicates when to sample data)

In several embodiments of the instant description, the error detection and correction (EDC) and timing reference signal (TRS) are illustrated, with the TRS signal sharing a signaling resource (pin, interconnect etc.) with data and with the EDC signal conveyed over a dedicated EDC signal line between the memory controller and a memory device. In other embodiments, the EDC signal and the TRS signal can each be conveyed, over respective dedicated signaling resources, between the memory controller and a memory device. For example, during a read operation, the TRS signal is transmitted by a memory device over a first signal line and is to be received by the memory controller before the read data is received (over separate signal lines) so that the memory controller can adjust its timing alignment to properly receive the read data. For the EDC operation corresponding to the memory read operation, the EDC signal is provided from the memory device over a second signal line and is skewed to be later in time than the resulting read data output since the EDC codes must be calculated before being transmitted from the memory device to the memory controller.

To prevent the EDC and/or TRS signals provided from different ranks from interfering with each other, additional spacing may be introduced between reads operations from different ranks. In an embodiment, to improve system bandwidth that may be otherwise consumed as a result of the additional spacing, the memory device limits the duration of the TRS and EDC signals for each transaction to be equal to the data burst length for the transaction (either read or write.) The TRS and EDC signals and read data have the same burst length and are skewed in time for their particular operation. For example, the TRS signal associated with a read operation is skewed to be earlier than the corresponding data in order to provide sufficient time for the memory controller to acquire timing information from the TRS signal before the data burst of the read operation begins. In this embodiment, the memory device begins sending the TRS signal between the time when it receives the read command ("read with TRS") and the time at which the memory device transmits the first bit of data of the corresponding read data. In addition, the memory device skews the timing of the EDC transmission corresponding to the read data to commence later than the time at which the memory device transmits the first bit of data.

Figure 4B:
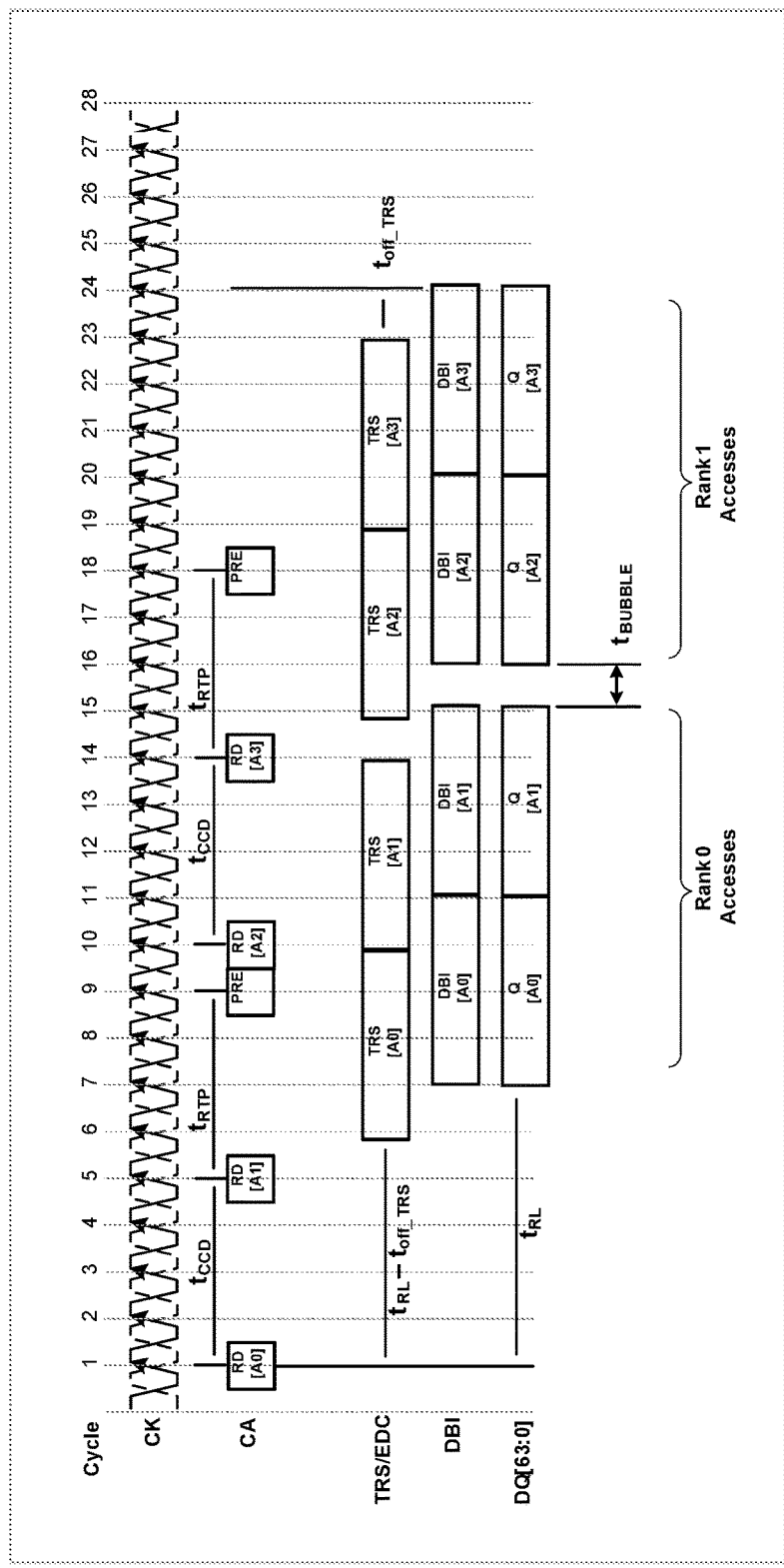
FIG. 4B presents a timing diagram illustrating preamble-based fast timing updates during read memory transactions using a dedicated signaling resource for TRS/EDC modes.

In an embodiment, both the EDC and TRS are conveyed (either in TRS mode or in EDC mode) over the same signal line between the memory device and the memory controller. FIG. 4B presents a timing diagram illustrating preamble-based fast timing updates during read memory transactions using a dedicated signaling resource for TRS/EDC modes. Specifically, FIG. 4B illustrates memory read transactions with a TRS/EDC signaling resource configured in TRS mode, where a TRS signal is output by the memory device, prior to a corresponding first bit of data being output by the memory device. A transmitter circuit on the memory device provides the TRS/EDC to the memory controller via the TRS/EDC signaling resource in accordance with the mode programmed by the memory controller, or specified by the memory controller on a per read transaction basis.

In an embodiment, a register on the memory device stores a value which specifies either TRS mode or EDC mode. In this example, the timing of when each of the TRS and EDC signals are transmitted is shifted depending on which signal is being transmitted. For example, in TRS mode, the TRS signal burst would be shifted to commence before the corresponding read data burst commences, for example, as is illustrated in FIG. 4B, and in EDC mode, the EDC signal would be shifted to commence after corresponding read data burst commences. In this embodiment and in embodiments described above, the memory device may set the burst length of the TRS and EDC signals for each transaction to be equal to the data burst length for the memory transaction (either read or write). The burst length for the memory transaction is stored as a representative value in a programmable register on the memory device.

In various embodiments, registers disposed on the memory device store values that represent time intervals between TRS/EDC and data transmission. In more detail a first register, disposed on the memory device, may be programmed by the controller via a set register command accompanied by a first value that the memory device receives and stores in the first register. The first value represents a first time interval that transpires between a referenced point of the timing reference signal (e.g., a first toggle of the TRS burst, or last toggle of the TRS burst) and the beginning, or first bit of the data burst. The first time interval may be, for example, be expressed as a number of clock cycles or a number of nano seconds that transpire.

For a data to EDC time interval, a second register, disposed on the memory device, may be programmed by the controller via the set register command accompanied by a second value that the memory device receives and stores in the second register. The second value represents a first time interval that transpires between a referenced point of the data burst (e.g., launching of the first bit of data) and, for example, the beginning, or first bit of the EDC burst. The second time interval may, for example, be expressed as a number of clock cycles or a number of nanoseconds that transpire.

In another embodiment, the functionality of the first and second registers is served by a single register that specifies a time interval that is applied, depending on which mode the memory device is programmed to be in. For example, a single register, in this embodiment, contains a value that represents a timing interval that separates TRS and data output for TRS mode, and specifies a timing interval that separates data and EDC output for EDC mode.

In another embodiment, the controller can specify individual burst lengths for the TRS and EDC signals via corresponding programmable registers on the memory device. These registers may be programmed via a register program command in which values that represent burst lengths for the TRS and EDC signals are conveyed from the controller and stored in their respective registers. Alternatively, the EDC and TRS burst lengths may be specified by information that is provided with the memory access commands (e.g., Read and Write commends) for a corresponding memory access. In another embodiment, multiple sets of programmable registers are implemented on a memory device. Each set of programmable registers stores values that are representative of respective different selectable EDC burst lengths and TRS burst lengths. Information provided with a memory access command specifies which register is selected to provide the burst length for the EDC and TRS signals.

Figure 5:
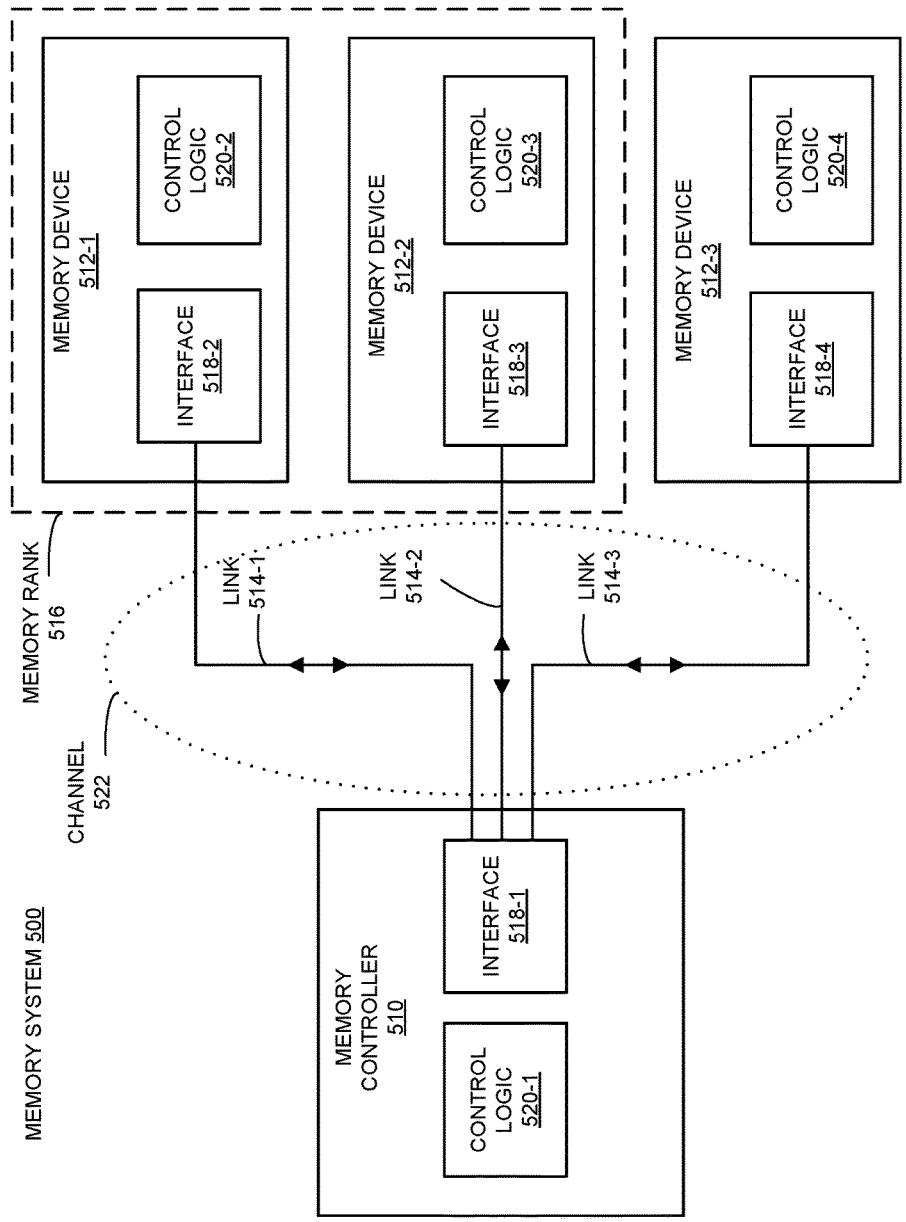
FIG. 5 presents a block diagram illustrating an embodiment of a memory system, which includes at least one memory controller and one or more memory devices.

Additional embodiments of memory systems that may use one or more of the above-described apparatus and techniques are described below with reference to FIG. 5. FIG. 5 presents a block diagram illustrating an embodiment of a memory system 500, which includes at least one memory controller 510 and one or more memory devices 512 arranged in each rank. Memory controller 510 and each memory device 512 are individual integrated circuit devices, which may be included in a single chip-package. For example, memory controller 510 may be stacked with one or more memory devices 512 in a through-silicon via (TSV) stack. Alternatively, multiple memory devices 512 may be integrated in a TSV stack, such that one of them may act like a "memory controller" which requests TRS from other memory devices 512 in the stack.

In some embodiments, memory controller 510 is a local memory controller (such as a DRAM memory controller) and/or is a system memory controller (which may be implemented in a microprocessor, an application-specific integrated circuit (ASIC), a system-on-a-chip (SoC) or a field-programmable gate array (FPGA)).

Memory controller 510 may include an I/O interface 518-1 and control logic 520-1. In some embodiments, one or more of memory devices 512 include control logic 520 and at least one of interfaces 518. However, in some embodiments some of the memory devices 512 may not have control logic 520. Moreover, memory controller 510 and/or one or more of memory devices 512 may include more than one of the interfaces 518, and these interfaces may share one or more control logic 520 circuits. In some embodiments one or more of the memory devices 512 is configured as a memory rank 516.

As discussed in conjunction with FIGS. 1A, 1B, 2, 3 and 4, control logic 520-1 on memory controller 510 may be used to issue "read with preamble" commands to ranks within memory devices 512 to request timing reference signals for fast timing updates when these ranks are being accessed for the first time after having been idle. Memory controller 510 can also determine a suitable length for each TRS being requested. Note that the techniques described in conjunction with FIGS. 1A, 1B, 2, 3 and 4 may also be applied in systems with only one rank of memory, when this single rank has not been accessed for some period of time, thus requiring the same timing update as described for a multi-rank system.

Memory controller 510 and memory devices 512 are coupled by one or more links 514, such as multiple wires, in a channel 522. While memory system 500 is illustrated as having three links 514, other embodiments may have fewer or more links 514. Moreover, these links may provide: wired, wireless and/or optical communication. Furthermore, links 514 may be used for bidirectional and/or unidirectional communication between the memory controller 510 and one or more of the memory devices 512. For example, bidirectional communication between the memory controller 510 and a given memory device may be simultaneous (full-duplex communication). Alternatively, the memory controller 510 may transmit information (such as a data packet which includes a command) to the given memory device, and the given memory device may subsequently provide the requested data to the memory controller 510, e.g., a communication direction on one or more of the links 514 may alternate (half-duplex communication). Also, one or more of the links 514 and corresponding transmit circuits and/or receive circuits may be dynamically configured, for example, by one of the control logic 520 circuits, for bidirectional and/or unidirectional communication.

Signals corresponding to data and/or commands (such as request-for-data commands) may be communicated on one or more of the links 514 using either or both edges in one or more timing signals. These timing signals may be generated based on one or more clock signals, which may be generated on-chip (for example, using a phase-locked loop and one or more reference signals provided by a frequency reference) and/or off-chip. Note that the CA bus on links 514 may be used to convey signals having predetermined functional definitions (e.g. Bank address, Write enable, Chip select, etc.) or it may be packetized on a smaller set of pins.

In some embodiments, commands are communicated from the memory controller 510 to one or more of the memory devices 512 using a separate command link, i.e., using a subset of the links 514 which communicate commands. However, in some embodiments commands are communicated using the same portion of the channel 522 (i.e., the same links 514) as data. Moreover, communication of commands: may have a lower data rate than the data rates associated with communication of data between the memory controller 510 and one or more of the memory devices 512; may use different carrier frequencies than are used to communicate data; and/or may use a different modulation technique than is used to communicate data.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

We claim:

1. A method of operation in a memory controller, the method comprising:
    transmitting a read command which specifies that a
        memory device output data accessed from a memory core via a data bus, the data to be output by the memory device as a burst of data words;

provided that the burst of data words follows a period of specified duration during which the memory device was not exchanging data with the memory controller, transmitting information to the memory device which specifies whether the memory device is to commence outputting of a specified timing reference signal prior to commencing outputting of the burst of data words; and receiving the timing reference signal if the information specified that the memory device output the timing reference signal.

2. The method of claim 1, wherein transmitting the information to the memory device comprises programming a register of the memory device to cause the outputting of the specified timing reference signal prior to commencing outputting of the burst of data words.

3. The method of claim 1, wherein the timing reference signal comprises a toggling pattern having at least four bits.

4. The method of claim 3, wherein the method further comprises receiving the toggling pattern at the memory controller and using the toggling pattern to perform at least one phase update of a timing signal used to exchange data with the memory device via the data bus.

5. The method of claim 3, wherein the memory device is a first memory device and corresponds to a first rank of memory, wherein the memory controller is also to exchange data with a second memory device which corresponds to a second rank of memory via the data bus, and wherein the transmitting of the information is performed in the event that the read command is to result in a switch of ranks exchanging data with the memory controller via the data bus.

6. The method of claim 3, wherein the toggling pattern is timed in dependence on a clock signal, and wherein the method further comprises transmitting the clock signal from the memory controller to the memory device.

7. The method of claim 1, wherein the timing reference signal is to be added to the head of the first available data associated with the burst of data words.

8. The method of claim 7, wherein the transmitting of the information to the memory device comprises transmitting the information as part of the read command.

9. The method of claim 1, wherein the method comprises sampling the burst of data words output from the memory device at the memory controller based on information provided by the specified timing reference signal output from the memory device.

10. A memory controller integrated circuit, comprising:
circuitry to transmit a read command to a memory device, the read command to cause the memory device to output data accessed from a memory core via a data bus, the data to be output by the memory device as a burst of data words;
circuitry to, provided that the burst of data follows a period of specified duration during which the memory device was not exchanging data with the memory controller integrated circuit via the data bus, transmit information to the memory device which specifies whether the memory device is to commence outputting of a specified timing reference signal prior to commencement of outputting of the burst of data; and
receiver circuitry to receive the timing reference signal if the information specified that the memory device output the timing reference signal.

11. The memory controller integrated circuit of claim 10, wherein circuitry to transmit the information to the memory device is to issue a register programming command to the memory device to program a register of the memory device to cause the output the specified timing reference signal prior to commencing output of the burst of data words.

12. The memory controller integrated circuit of claim 10, wherein the timing reference signal comprises a toggling pattern having at least four bits.

13. The memory controller integrated circuit of claim 12, wherein the memory controller integrated circuit further comprises phase update circuitry to update at least one phase value in response to receipt of the toggling pattern by the memory controller integrated circuit, said memory controller integrated circuit to use the at least one phase update of a timing signal used to exchange data with the memory device via the data bus.

14. The memory controller integrated circuit of claim 12, wherein the memory device is a first memory device and corresponds to a first rank of memory, wherein the memory controller integrated circuit is further to exchange data with a second memory device which corresponds to a second rank of memory via the data bus, and wherein the circuitry to transmit of the information to the memory device is to do so in the event of a rank switch.

15. The memory controller integrated circuit of claim 12, wherein the toggling pattern is to be timed dependent on a clock signal, and wherein the memory controller integrated circuit further comprises clock forwarding circuitry to provide the clock signal to the memory device.

16. The memory controller integrated circuit of claim 10, wherein the timing reference signal is to be added to the head of the first available data associated with the burst of data words.

17. The memory controller integrated circuit of claim 16, wherein said memory controller integrated circuit is to transmit the information to the memory device as part of the read command.

18. The memory controller integrated circuit of claim 10, wherein the memory controller integrated circuit is to sample the burst of data words output from the memory device at the memory controller based on information provided by the specified timing reference signal output from the memory device.

19. A memory controller integrated circuit to control dynamic random access memory (DRAM) devices corresponding to respective ranks of memory, comprising:
circuitry to transmit a read command to one of the DRAM devices, the read command to cause the one of the DRAM devices to output data accessed from a memory core via a data bus common to the DRAM devices, the data to be output by the one of the DRAM devices as a burst of data words;
circuitry to, provided that the burst of data follows a period of specified duration during which the memory device was not exchanging data with the memory controller integrated circuit via the data bus, transmit information to the memory device which specifies whether the memory device is to commence outputting of a specified timing reference signal prior to commencement of outputting of the burst of data; and
receiver circuitry to receive the timing reference signal if the information specified that the one of the DRAM devices output the timing reference signal;
wherein the timing reference signal comprises a toggling pattern having at least four bits.

20. The memory controller integrated circuit of claim 19, wherein the memory controller integrated circuit further comprises phase update circuitry to update at least one phase value respective to the one of the DRAM devices in response to receipt of the toggling pattern by the memory controller integrated circuit, said memory controller integrated circuit to use the at least one phase update of a timing signal used to exchange data with the one of the DRAM devices via the data bus.

21. The memory controller integrated circuit of claim 19, wherein the transmission of the information to the memory device is performed in the event that the read command corresponds to a rank switch relative to data last exchanged with the memory controller integrated circuit via the data bus.

22. The memory controller integrated circuit of claim 19, wherein circuitry to transmit the information to the one of the DRAM devices is to issue a register programming command to a selective one of the DRAM devices to program a register of the selective one of the DRAM devices, to cause the output the specified timing reference signal prior to commencing output of a burst of data.

* * * * *